(12) United States Patent
Lee et al.

(10) Patent No.: US 7,692,362 B2
(45) Date of Patent: Apr. 6, 2010

(54) ACTUATING DEVICE, FABRICATING METHOD THEREOF, AND MODULE VARIATION CONTROL DEVICE USING THE ACTUATING DEVICE

(75) Inventors: Hwa-sun Lee, Suwon-si (KR);
Sung-hee Lee, Suwon-si (KR);
Seung-mo Lim, Suwon-si (KR);
Hee-moon Jeong, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 186 days.

(21) Appl. No.: 12/014,121

(22) Filed: Jan. 15, 2008

(65) Prior Publication Data
US 2009/0026885 A1  Jan. 29, 2009

(30) Foreign Application Priority Data
Jul. 24, 2007  (KR) .................. 10-2007-0074130

(51) Int. Cl.
*G03B 17/00* (2006.01)

(52) U.S. Cl. .................. 310/328; 310/323.01; 396/55

(58) Field of Classification Search .................. 310/328
See application file for complete search history.

(56) References Cited

U.S. PATENT DOCUMENTS

| 5,956,529 | A | * | 9/1999 | Lee et al. ...................... 396/55 |
| 7,355,630 | B2 | * | 4/2008 | Uenaka et al. ........... 348/208.2 |
| 7,412,160 | B2 | * | 8/2008 | Nakanishi et al. ........... 396/133 |
| 7,593,628 | B2 | * | 9/2009 | Ito et al. ...................... 396/55 |
| 2006/0056829 | A1 | * | 3/2006 | Hirota et al. .................. 396/54 |

* cited by examiner

*Primary Examiner*—Walter Benson
*Assistant Examiner*—Bryan P Gordon
(74) *Attorney, Agent, or Firm*—Sughrue Mion, PLLC

(57) ABSTRACT

An actuating device is provided, which includes a deformable membrane, walls formed on the membrane to define cavities, rods formed within the cavities, and on the surface of the membrane on one side with reference to a cavity center, to move in association with the deformation of the membrane, and an actuating unit formed on a lower side of the membrane to be piezoelectrically driven to deform the membrane. The actuating device is applicable to miniaturized electronic devices and can actuate the function modules appropriately.

16 Claims, 10 Drawing Sheets

ACTUATING DEVICE, FABRICATING METHOD THEREOF, AND MODULE VARIATION CONTROL DEVICE USING THE ACTUATING DEVICE

CROSS-REFERENCE TO RELATED APPLICATIONS

This application claims the benefit of Korean Patent Application No. 10-2007-0074130, filed Apr. 24, 2007, in the Korean Intellectual Property Office, the entire disclosure of which is incorporated herein by reference.

BACKGROUND OF THE INVENTION

1. Field of the Invention

Devices and methods consistent with the present invention relate to an actuating device, a fabricating method thereof, and a module variation control device using the actuating device, and more particularly, to an actuating device for actuating variation of function module using a deformable membrane and rod, a fabricating method thereof, and a module variation control device using the actuating device.

2. Description of the Related Art

Advanced electronic technology has brought about widespread use of portable electronic devices with diversified functions. Camera and video functions gained so much popularity that various portable devices such as digital camera, digital camcorder, mobile phone, or PDA adopt these functions.

The quality of still or video images depends on many factors, and hand tremor is one major example of such factors. A user taking photography has to take extra caution not to make any hand tremor because if generated, such tremor can blur the image. A function for compensating hand tremor has thus been developed and made available.

Methods for compensating hand tremor can generally be grouped into two categories: software compensation that compensates data captured through CCD, and hardware compensation that includes shifting lens or CCD in accordance with hand tremor.

Because a system size increases in order to shift lens or CCD, the system is hard to apply to portable devices other than camera or camcorder. As a result, better hand tremor compensation is required in miniaturized devices such as mobile phone or PDA.

SUMMARY OF THE INVENTION

Exemplary embodiments of the present invention have been provided to address at least the above problems and/or disadvantages, and to provide at least the advantages described below. Accordingly, an exemplary aspect of embodiments of the present invention is to provide an actuating device which achieves miniaturization by using deformable membrane and rod to actuate function modules, a module displacement adjusting device using the actuating device, and a method for fabricating the actuating device simply.

The foregoing and other objects and advantages are substantially realized by providing an actuating device, including a deformable membrane, walls formed on the membrane to define cavities, rods formed within the cavities, and on the surface of the membrane on one side with reference to a cavity center, to move in association with the deformation of the membrane, and an actuating unit formed on a lower surface of the membrane to be piezoelectrically driven to deform the membrane.

The actuating unit may include a first electrode, a piezoelectric layer and a second electrode stacked on the lower surface of the membrane in sequence.

The area of at least one of the first electrode, the piezoelectric layer and the second electrode may be smaller than the area of the membrane where the cavities are formed.

The walls may define a plurality of cavities on the membrane, and the rods may be formed within the plurality of cavities respectively. The plurality of cavities may be defined by a plurality of blocks, and positions and shapes of the rods within the cavities may be different from each other according to the corresponding blocks.

The height of the rods may be greater than that of the walls.

The actuating device may further include an insulating film provided between the rods and the membrane, and between the walls and the membrane.

The foregoing and other objects and advantages are substantially realized by providing a module displacement adjusting device, including a function module, and an actuating module which adjusts the displacement of the function module by using rods which are placed within cavities formed on a deformable membrane, and on one side with reference to a cavity center, to move in association with the deformation of the membrane.

The module displacement adjusting device may further include a first electrode, a piezoelectric layer, and a second electrode stacked on a lower side of the membrane in sequence.

The module displacement adjusting device may further include a power supply unit to supply power for displacement adjustment of the function module to the first and second electrodes.

The area of at least one of the first electrode, the piezoelectric layer and the second electrode may be smaller than the area of the membrane where the cavities are formed.

The actuating module may further include walls which define a plurality of cavities on the membrane, and wherein the rods are formed within the plurality of cavities respectively.

The plurality of cavities may be defined by a plurality of blocks, and positions and shapes of the rods within the cavities are different from each other according to the corresponding blocks.

The module displacement adjusting device may further include a magnet unit which provides a magnetic attracting force between the function module and the actuating module to cause the function module and the actuating module to attach to each other, and a bearing unit arranged on an plane of attachment formed by the magnetic attracting force.

The module displacement adjusting device may further include a spring unit which provides a tension between the function module and the actuating module, and causes the function module and the actuating module to attach to each other, a first bearing unit arranged on connecting areas between the function module and the spring unit and between the actuating module and the spring unit, and a second bearing unit arranged on a plane of attachment formed by the tension.

The height of the rods may be greater than that of the walls.

The foregoing and other objects and advantages are substantially realized by providing a method for fabricating an actuating device, including fabricating a membrane, walls on the membrane to define cavities, and rods within the cavities, and on the surface of the membrane on one side with reference to a cavity center, and stacking a first electrode, a piezoelectric layer and a second electrode on a lower surface of the membrane.

The fabricating may include etching one side of a multi-layered wafer made out of a plurality of materials with an exception of the parts that correspond to the walls and the rods, to form a membrane that comprises the cavities, the walls and the rods formed on the one side of the multi-layered wafer, and also the materials of the other side of the multi-layered wafer.

The fabricating may include etching one side of the multi-layered wafer, thereby leaving depressions, and secondly etching the once etched side with depressions, thereby forming the cavities, the walls, and the rods in which the rods have the greater height than that of the walls.

The fabricating may include etching one side of a wafer, thereby forming the cavities, the walls and the rods, and forming the membrane on the other side of the wafer.

The stacking may include forming the first electrode on a lower side of the membrane, forming the piezoelectric layer below the first electrode and on areas that correspond to the cavities, and forming the second electrode below the piezoelectric layer.

The fabricating may include forming a plurality of cavities on the membrane and forming a plurality of rods within the cavities respectively. The fabricating may include forming a plurality of cavities divided as a plurality of blocks on the membrane, and forming the rods within the cavities in different positions and shapes according to the corresponding blocks.

BRIEF DESCRIPTION OF THE DRAWINGS

The above and other aspects and features of the present invention will become more apparent by describing certain exemplary embodiments of the present invention with reference to the accompanying drawings, in which.

Throughout the drawings, the same drawing reference numerals will be understood to refer to the same elements, features and structures.

DETAILED DESCRIPTION OF EXEMPLARY EMBODIMENTS

Certain exemplary embodiments of the present invention will now be described in greater detail with reference to the accompanying drawings.

The matters defined in the description, such as detailed constructions and elements, are provided to assist in a comprehensive understanding of the embodiments of the present invention and are merely exemplary. Accordingly, those of ordinary skill in the art will recognize that various changes and modifications of the exemplary embodiments described herein can be made without departing from the scope and spirit of the present invention. Descriptions of well-known functions and constructions are omitted for clarity and conciseness.

Figure 1:
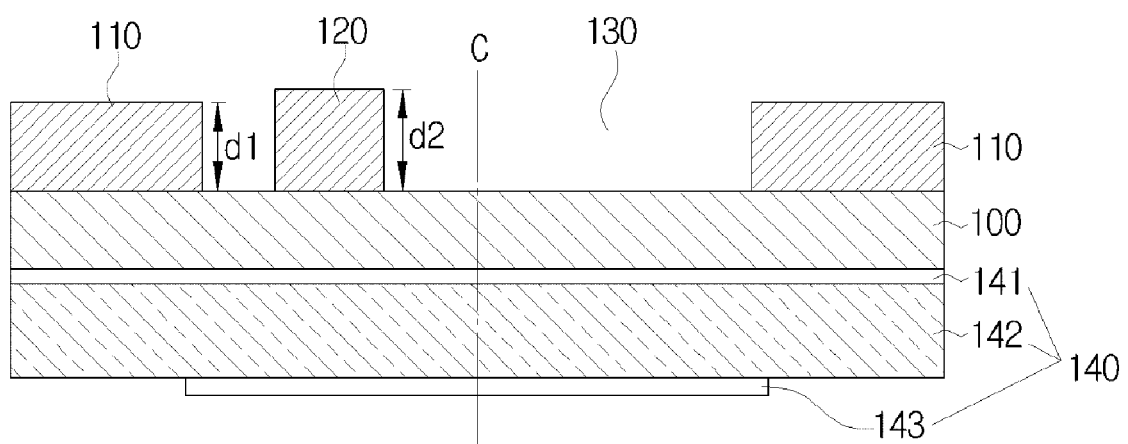
FIG. 1 is a cross section view of an actuating device according to an exemplary embodiment of the present invention.

FIG. 1 is a cross section view of an actuating device according to an exemplary embodiment of the present invention.

Referring to FIG. 1, an actuating device according to an exemplary embodiment of the present invention includes a membrane 100, a wall 110, a rod 120, and an actuating unit 140.

The membrane 100 refers to a layer having a low strength and so is deformable to bending or the like. The membrane 100 may be made out of dielectric material such as silicon. A wall 110 is placed on top of the membrane 100.

The wall 110 forms a predetermined form of cavity 130 on the membrane 100.

A rod 120 is placed within the cavity 130, preferably at a predetermined distance away from the centerline C of the cavity 130.

The actuating unit 140 is formed on a lower surface of the membrane 100.

The actuating unit 140 includes a first electrode 140, a piezoelectric layer 142, and a second electrode 143. With the application of electric current to the first and second electrodes 141, 143, the piezoelectric layer 142 produces a piezoelectric phenomenon, inducing deformation of the membrane 100 that contacts the actuating unit 140.

The rod 120, which is in contact with the membrane 100, is shifted in accordance with the deformation of the membrane 100. In detail, the rod 120 is lifted upward according to upward bending of the membrane 100, and dropped downwards according to the downward bending of the membrane 100. As doing so, the rod 120 converts upward and downward movement of the membrane 100 into oval or circular movement and transfers the converted force.

Because the rod 120 is placed away from the center of the membrane 100, the rod 120 is shifted away from the center of the membrane 100 according to the upward bending of the membrane 100, and shifted towards the center of the membrane 100 according to the downward bending of the membrane 100. If a function module such as CCD is placed above the rod 120, the function module would come into friction with the top of the rod 120 and accordingly moved along with the shifting of the rod 120. As a result, the function module is actuated.

The rod 120 may have a height d2 equal to or greater than a height d1 of the wall 110 to reinforce the friction with the function module. If the heights d1, d2 have a wider gap, even a slight displacement of the membrane 100 can cause the rod 120 to shift significantly. The rod 120 may be designed to have a height suitable for the purpose of use in consideration of such characteristics. For example, an actuating device for use in tremor-sensitive environment may have a rod 120 higher than the wall 110. If an actuating device is applied to a device with less tremor, the rod 120 may be formed at the same height d2 as the wall 110. The wall 110 may have a height d1 greater than the thickness of the membrane 100 so as not to be deformed by the displacement of the membrane 110.

Although FIG. 1 illustrates the second electrode 143 in configuration that corresponds to the size of the cavity 130, other elements such as piezoelectric layer 142 or the first electrode 141 may also have the corresponding size and also position. For example, the actuating unit 140 may have the same area as the cavity 130 or less. By doing so, greater actuating effect is obtained under the application of the same electric current, when the actuating unit 140 is formed on the entire lower side of the membrane 100.

An insulating layer may additionally formed on the top surface of the membrane 100 (FIG. 1). Accordingly, elements like membrane 100, wall 110 and rod 120 may be fabricated at once by partly etching the silicon on a silicon-on-insulator (SOI) wafer. In this case, the insulating layer within the SOI wafer may function as an etching stop layer during the etching, and may be exposed through the bottom side of the cavity 130. The remaining silicon material from the etching forms the wall 110 and the rod 120. When the membrane 100, wall 110 and rod 120 are fabricated in this manner, an insulating layer may additionally formed on the top surface of the membrane 100. This will be explained in detail below.

Figure 2:
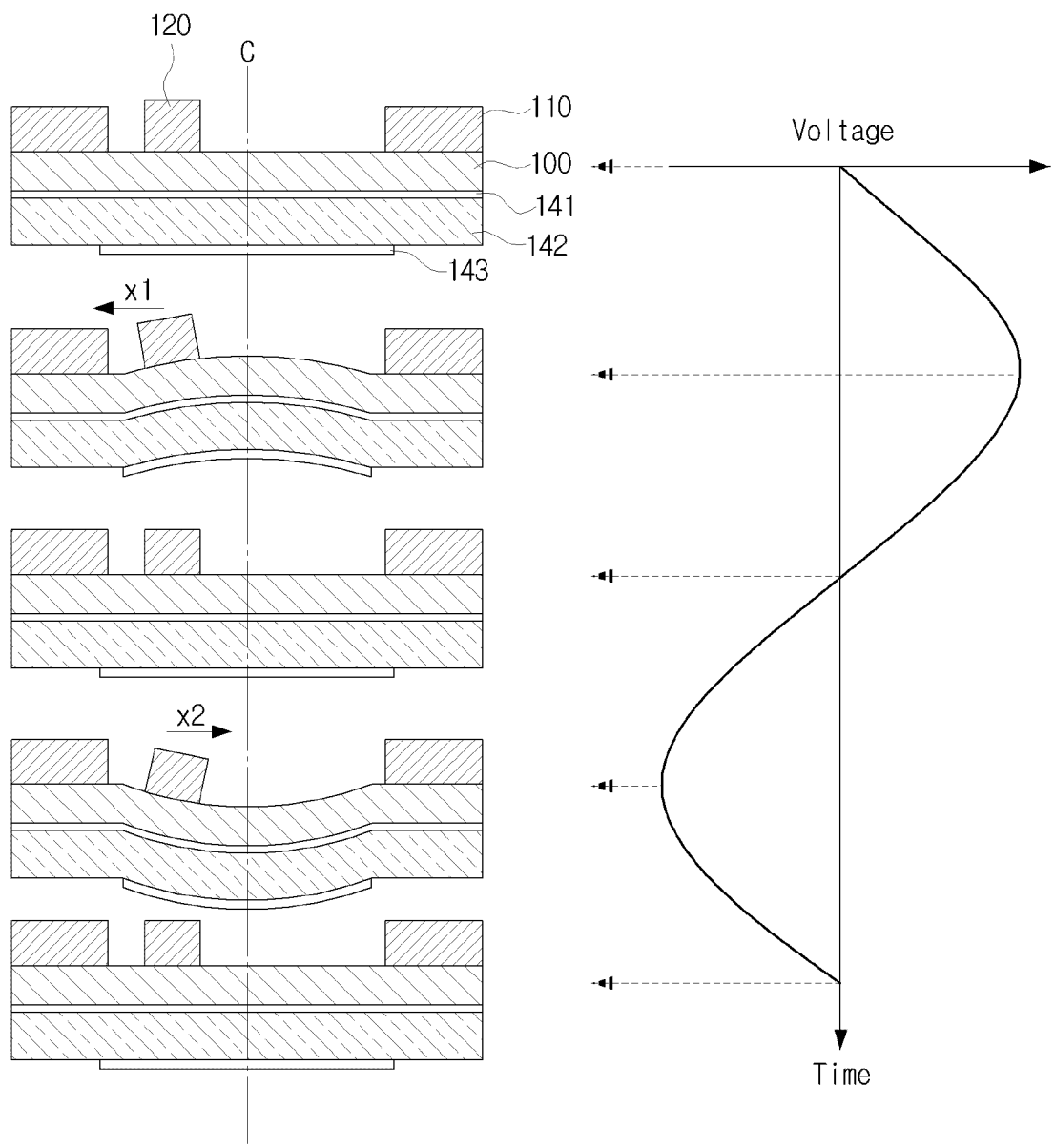
FIG. 2 illustrates the processes in which the actuating device of FIG. 1 is actuated by a driving power.

FIG. 2 illustrates the processes in which the actuating device of FIG. 1 is actuated by a driving power. A sine wave is applied to the first and second electrodes 141, 143 as a driving voltage, with the periodicity that corresponds to the resonating frequency of the membrane 100 and the piezoelectric layer 142. The membrane 100 within the cavity 130 bends upwards while (+) potential of driving power is applied. Accordingly, the rod 120 is shifted away from the centerline (C) in X1 direction. The membrane 100 within the cavity 130 bends downwards while (−) potential is applied. Accordingly, the rod 120 is shifted towards the centerline (C) in X2 direction.

The actuating device of FIG. 1 may have a plurality of cavities 130, and a plurality of rods 120 so that one rod 120 can be placed in each of the cavities 130.

Figure 3:
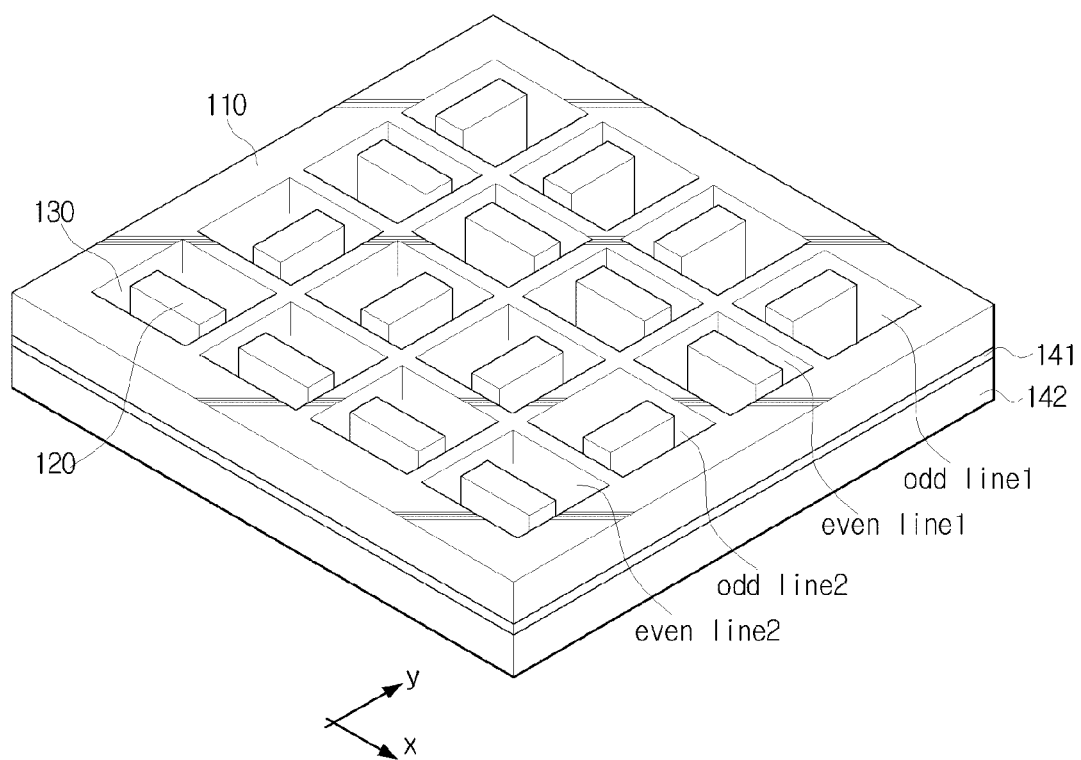
FIG. 3 illustrates the structure of an actuating device having a plurality of cavities.

FIG. 3 illustrates the structure of an actuating device having a plurality of cavities. The actuating device includes a plurality of cavities 130. Each of the cavities 130 may be divided into a plurality of blocks. The example illustrated in FIG. 3 has cavities 130 formed in lines of blocks.

Rods 120 may be placed in each of the cavities 130 in different positions and in different shapes. For example, a rod 120 in one cavity 130 may be put to an opposite position to another rod 120 in another cavity 130, or may have different shape.

The cavities 130 may be arranged in odd and even lines. The odd lines of rods 120 may be arranged in a bar shape along Y axis, while even lines of rods 120 are arranged in a bar shape along X axis.

In one example, the rods 120 in odd lines may be used to actuate in X direction, while the rods 120 in even lines are used to actuate in Y direction. By shaping the rods 120 differently according to the cavities these are placed, an area to rub against the module to be placed thereabove can expand, and actuating can be facilitated as a result.

The rod 120 in the uppermost odd line (odd line 1) and the rod 120 in the third line (odd line 2) may be positioned to face opposite directions with reference to the centerline of each cavities 130. Likewise, the rods 120 in the even lines (even line 1, even line 2) may be positioned to face opposite direction with reference to the centerline of each cavities 130. By doing so, function modules can be actuated in various directions on a single plane, and 2-axis actuation is thus enabled.

Although FIG. 3 illustrates an example of square cavities 130, one will understand that the cavities 130 may be formed to various shapes such as circle, partially rounded squares, or the like.

Figure 4A:
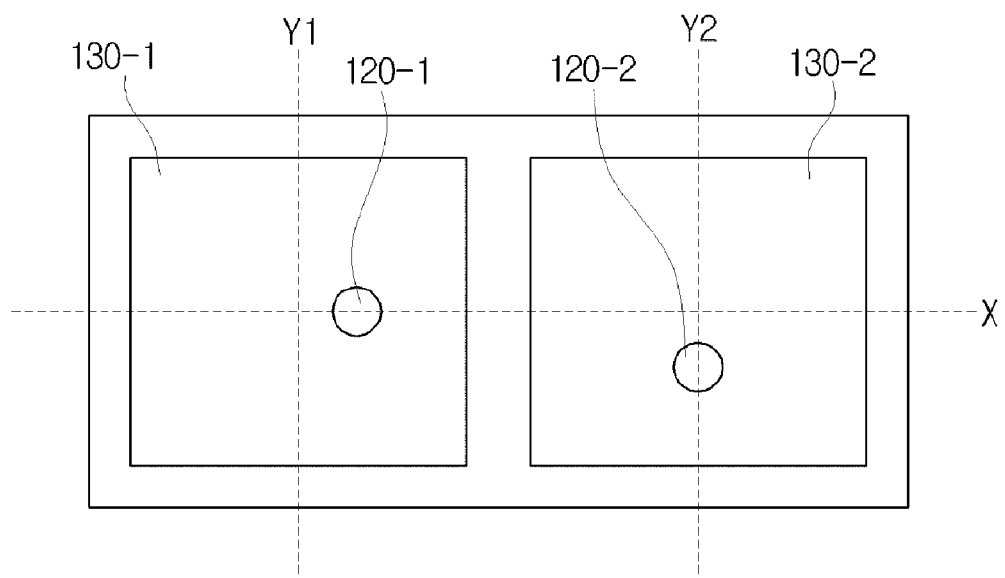
FIGS. 4A and 4B illustrate top and bottom structures of some parts of an actuating device.
Figure 4B:
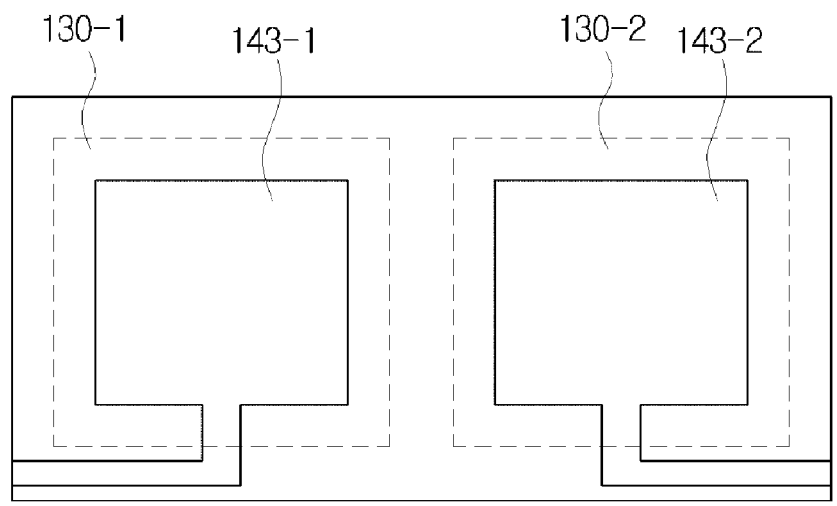

FIGS. 4A and 4B show front and rear sides of an actuating device with reference to two cavities 130-1, 130-2. In FIG. 4A, the rod 120-1 in the left cavity 130-1 is at a right side with reference to the cavity center, that is, with reference to a point where X-axis and Y1-axis meet. The rod 120-2 in the right cavity 130-2 is placed below the cavity center, that is, with reference to a point where X-axis and Y2-axis meet. As a result, the left cavity 130-1 is used in actuating the function module that rubs against the rod 120-1 along the X-axis, while the right cavity 130-2 is used in actuating the function module that rubs against the rod 120-2 along the Y-axis.

FIG. 4B shows the rear side of the actuating device. Referring to FIG. 4B, second electrodes 143-1, 143-2 are formed on a lower surface that corresponds to the area where the cavities 130-1, 130-2 are formed. The area of the second electrodes 143-1, 143-2 may be equal to or smaller than that of the cavities 130-1, 130-2.

Figure 5:
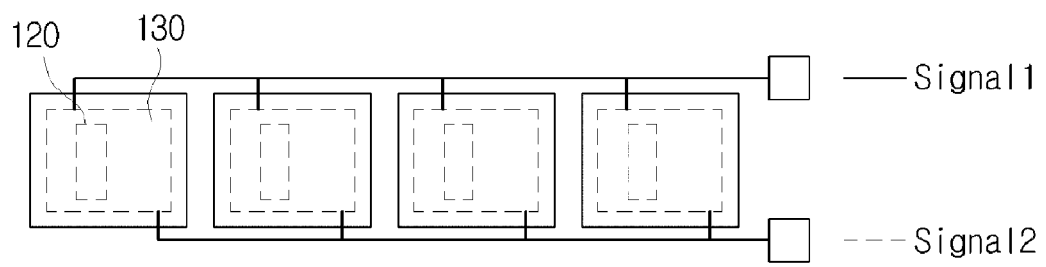
FIG. 5 illustrates a connecting structure that supplies power from an actuating device to a plurality of cavities of the actuating device.

Referring to FIG. 5 which illustrates a power supply line to supply power to a plurality of cavities, powers 1, 2 (signal 1, 2) are supplied to first and second electrodes 141, 143 corresponding to the cavities, to control the rods 120 of the cavities 130 at once.

Figure 6:
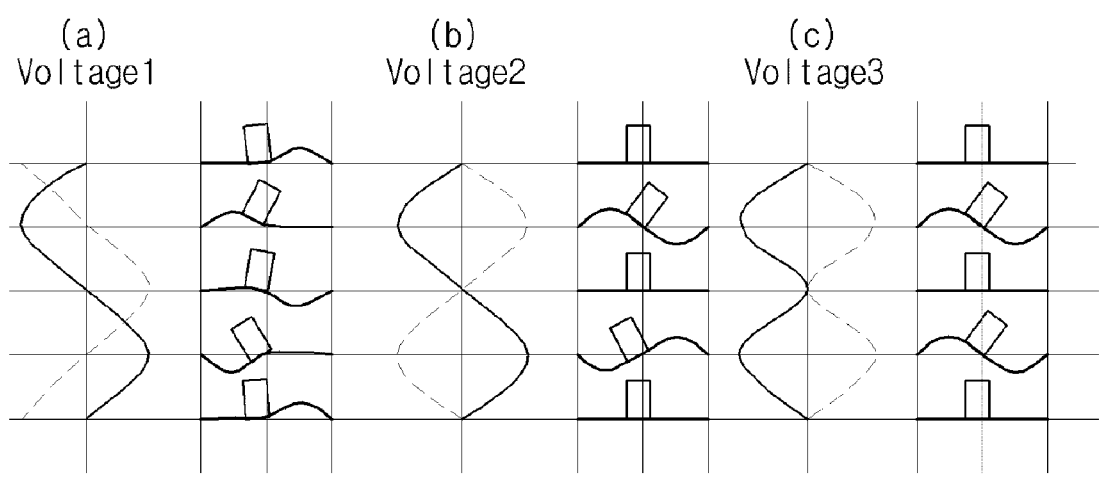
FIG. 6 illustrates displacement of rod being adjusted according to changes in driving power.

Referring to FIG. 6A to FIG. 6C which illustrate displacement of rod according to changes in power size, FIG. 6A illustrates rod displacement made when signal 1 and signal 2 having inverse-phase are delayed by ¼ of periodicity (voltage 1). The rod 120 may be shifted rightwards and leftwards, and FIG. 6A indicates that the rod 120 is more shifted to a left side.

FIG. 6B illustrates rod displacement made when signals 1 and 2 are input in a sine wave having inverse phase (voltage 2). The rod 120 is shifted leftwards and rightwards by the same distance.

FIG. 6C illustrates rod displacement made when signals 1 and 2 are input in a wave of full-wave rectification having inverse phase (voltage 3). The rod 120 is shifted by the maximum distance to the right side whenever the distance between signals 1 and 2 reaches maximum. The rod 120 keeps vertical when signals 1 and 2 have same value.

Therefore, precise actuation is enabled by controlling the sizes of signals 1 and 2 appropriately according to the rod displacements of FIGS. 6A to 6C.

FIGS. 7A to 7D are cross sections provided to explain a method of fabricating an actuating device according to an exemplary embodiment of the present invention.

Figure 7A:
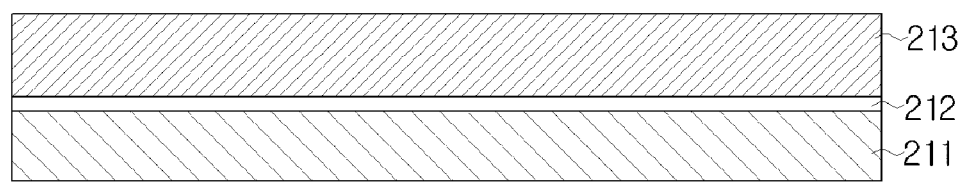
FIGS. 7A to 7D are cross section views provided to explain a method for fabricating an actuating device according to an exemplary embodiment of the present invention.

Referring first to FIG. 7A, a multi-layered wafer having a plurality of layers 211, 212, 213 is prepared. The multi-layered wafer may be a silicon-on-insulator (SOI) wafer, and the SOI wafer may include a first insulating layer 211, an insulating film 212, and a second insulating layer 213.

Figure 7B:
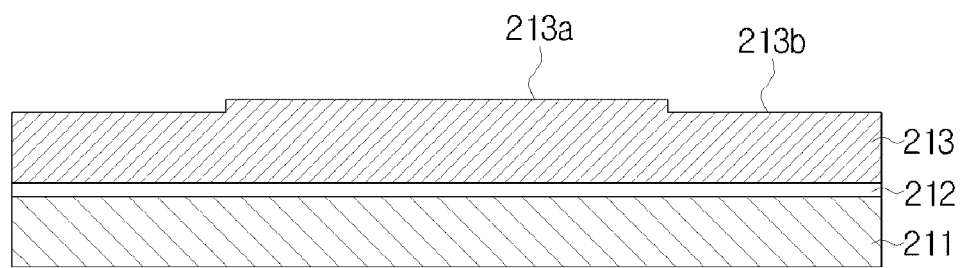

Referring to FIG. 7B, the second layer 213 on the SOI wafer is partially depressed, thereby dividing the second layer 213 into an upper layer 213a and a lower layer 213b. The depressions are formed to a predetermined depth, in consideration of the fact that the depth of the depressions decides the difference between the height of the rod 230 and the walls 220 that will be formed at a later stage.

Figure 7C:
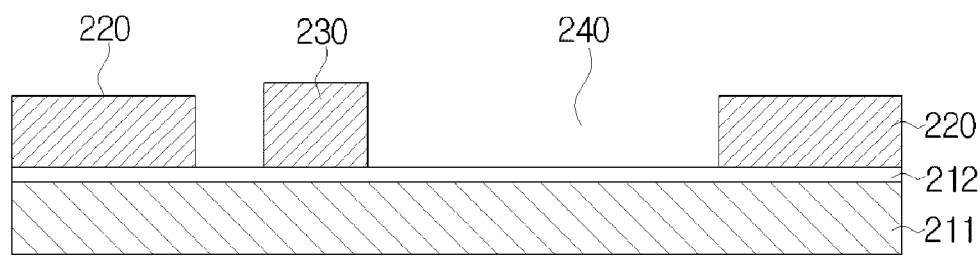

Referring to FIG. 7C, the side having the depressions is etched to form cavities 240. The insulating film 212 works as an etching stop layer, which causes the cavities 240 to be formed to the suitable depth. Unetched lower layer 213b forms the walls 220, and unetched upper layer 213a forms the rods 230. The first insulating layer 211 at the other side of the multi-layered wafer serves as a membrane. The rods 230 are at a predetermined distance away from the cavity center.

Figure 7D:
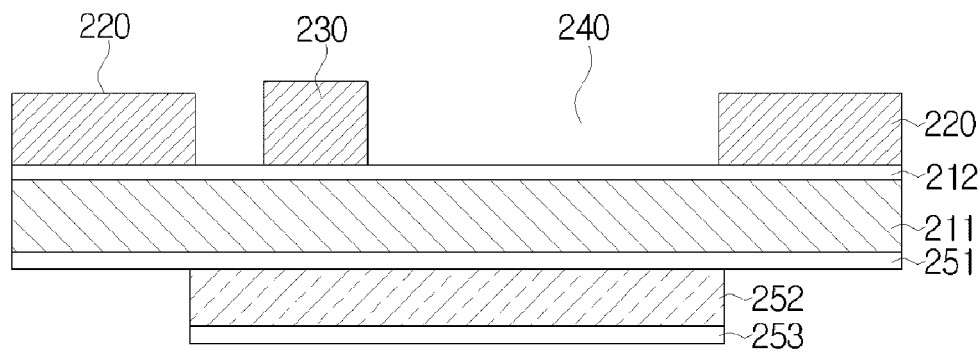

Referring to FIG. 7D, an actuating is formed by stacking on the lower side of the first insulating layer 211 in the sequence of a first electrode 251, a piezoelectric layer 252, and a second electrode 253.

While FIGS. 7A to 7D illustrate an actuating device fabricated using an SOI wafer, one will understand that an actuating device may be fabricated by using a general wafer. In order to fabricate an actuating device using a general wafer, first, one side of a general wafer is partly depressed, and a material layer for membrane is stacked on the opposite side. The depression-formed area is then etched, thereby forming cavities, walls and rods altogether, and then the first electrode, piezoelectric layer and second electrode are sequentially stacked on the lower side of the membrane.

Furthermore, while FIGS. 7A to 7D illustrate until the process of stacking first electrode, piezoelectric layer and second electrode, one will understand that an actuating device, suitable in shape and size for an intended function module, can be fabricated by adding processes like sawing, sintering, polling, and interconnecting.

Figure 8:
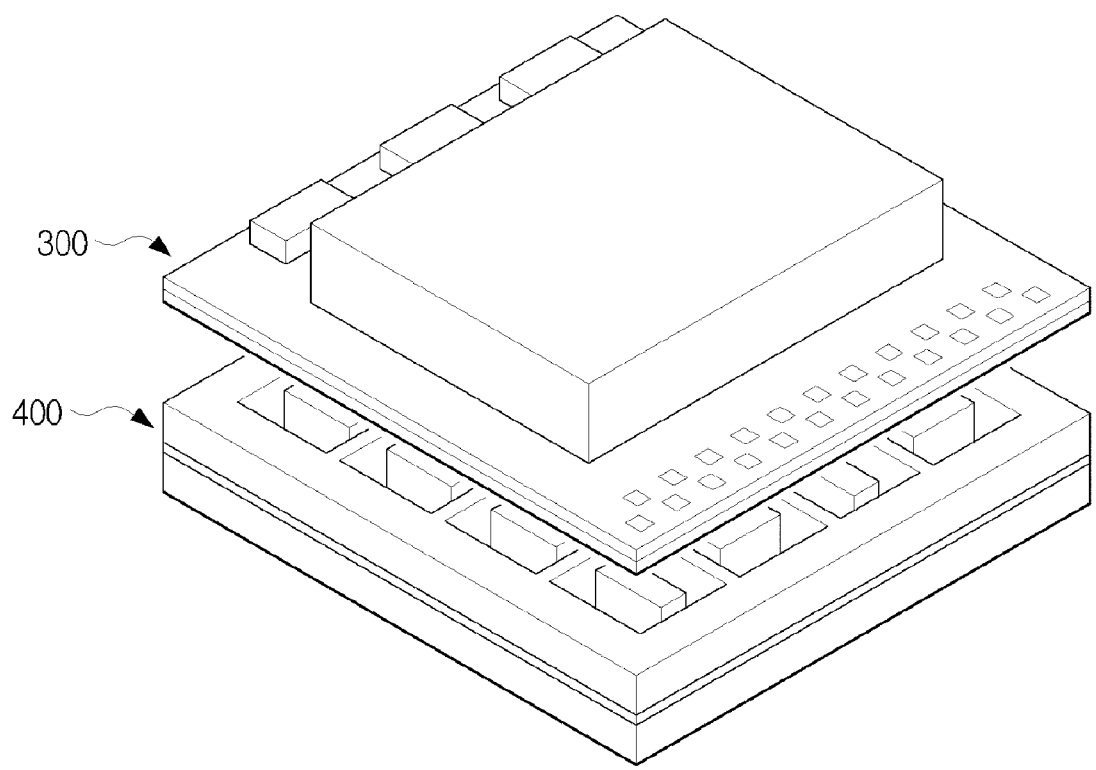
FIG. 8 illustrates the structure of a module displacement adjusting device according to an exemplary embodiment of the present invention.

FIG. 8 illustrates the structure of a module displacement adjusting device according to an exemplary embodiment of the present invention. The module displacement adjusting device includes a function module 300 and an actuating module 400.

The function module 300 herein refers to one independent chip or module that performs functions independently. The function module 300 may be a CCD.

The actuating module 400 actuates the function module 300 appropriately to adjust the displacement. The actuating device illustrated in FIG. 1 may be implemented as the actuating module 400.

Figure 9:
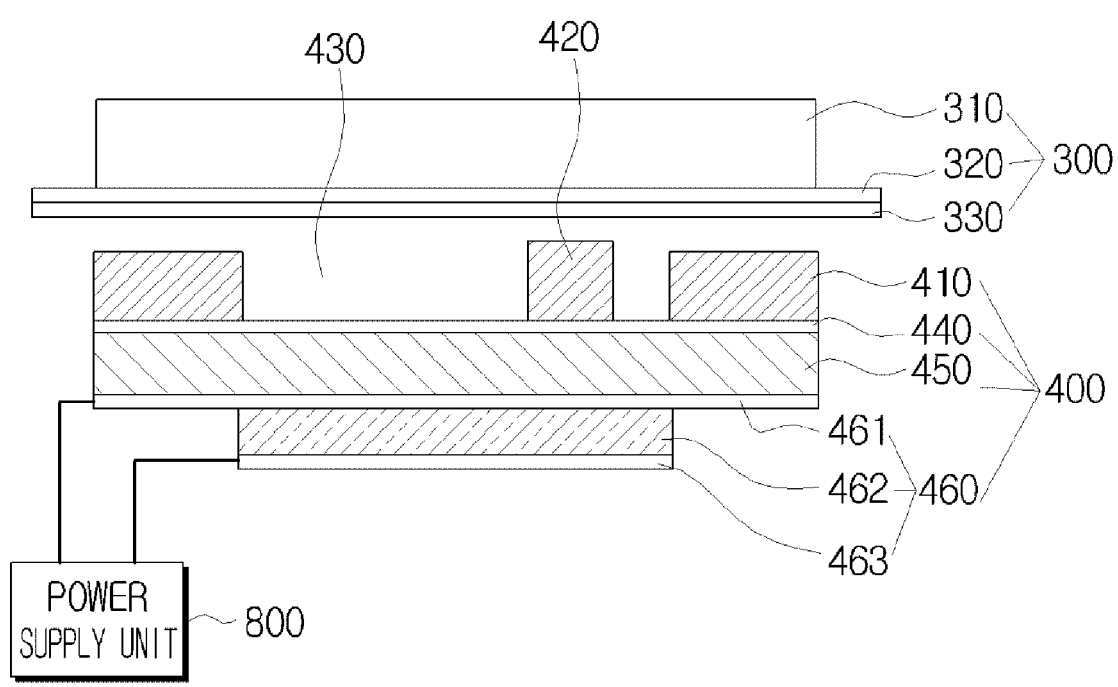
FIG. 9 is a cross section view illustrating the module displacement adjusting device of FIG. 8.

FIG. 9 is a cross section view illustrating the structure of the module displacement adjusting device of FIG. 8. The function module 300 includes a CCD 310, a PCB 320 and a friction member layer 330.

The CCD 310 operates to photograph an image of an object and outputs corresponding data, and the PCB 320 is a board that supports the CCD 310 and to transmit input and output of the CCD 310. The friction member layer 330 is made out of a frictional member to increase friction with the rods 420. The function module 300 may be called as a rotor as generally called in the related art.

The actuating module 400 includes walls 410, rods 420, an insulating layer 440, a membrane 450, and an actuating unit 460. The actuating unit 460 includes a first electrode 461, a piezoelectric layer 462, and a second electrode 463.

The actuating module 400 may implement the structure of an actuating device as explained above with reference to FIGS. 1 to 7.

The rods 420 are placed within the cavities 430 and distanced away from the cavity centers, respectively. The rods 420 are moved in association with the deformation of the insulating layer 440 and the membrane 450 which serve as the bottom of the cavities 430.

With the application of a driving power from a power supply unit 800 to the first and second electrodes 461, 463, the piezoelectric layer 462 produces piezoelectric effect, and as a result, the membrane 450 bends upwards or downwards, causing the rods 420 to move together.

The upper surface of the rods 420 partly contacts the friction member layer 330 of the function module 300, thereby pushing the rods 420 in the advancing direction and adjusting the displacement of the function module 300.

The power supply unit 800 may supply driving power for compensating minute vibration such as hand tremor. When implemented in an electronic device having camera function, the module displacement adjusting device according to the exemplary embodiments of the present invention can detect hand tremor using motion sensor or the like. Upon detecting hand tremor, the power supply unit 800 provides the actuating module 400 with a driving power having the frequency that corresponds to the detected result of hand tremor, so as to actuate the function module 300 appropriately and to minimize impact of the hand tremor.

Referring to FIG. 9, in order to adjust the displacement of the function module 300 by the rods 420, it is desirable that a predetermined degree of attraction is applied between the function module 300 and the actuating module 400.

Figure 10:
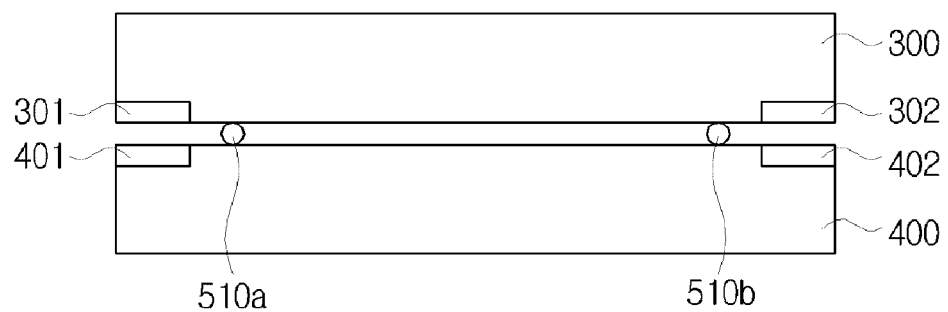
FIGS. 10 and 11 illustrate a structure to facilitating transfer of frictional force from the module displacement adjusting device to the function modules.
Figure 11:
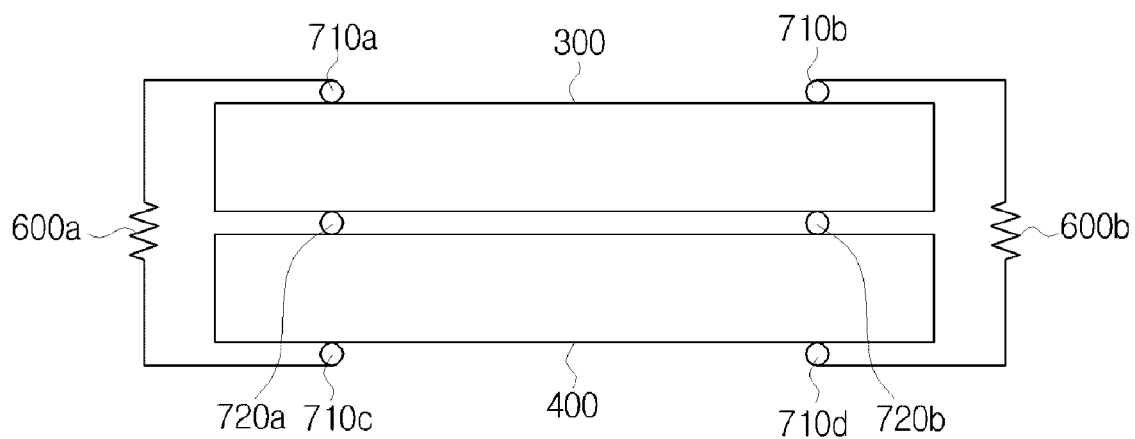

FIGS. 10 and 11 illustrates the structures added to the module displacement adjusting device, to facilitate the transmission of frictional force with respect to the function module 300.

Referring to FIG. 10, the function module 300 and the actuating module 400 are attached to each other by magnet parts 301, 302, 401, 402. Magnetic attraction applies between the two modules 300, 400 by the magnets 301, 302 of the function module 300 and the metals 401, 402 of the actuating module 400. As the two modules 300, 400 are attracted to each other with a predetermined degree of force, the rods 420 of the actuating module 400 are rubbed against the function module 300 more intensely.

Bearings 510a, 510b may additionally be placed between the connecting place between the two modules 300, 400. The presence of such bearings 510a, 510b enable smoother sliding of the function module 300 on the connecting plane with the actuating module and as a result, smoother actuating of the function module 300.

FIG. 11 illustrates the function module 300 and the actuating module 400 connected with each other by springs 600a, 600b. As tensions equivalent to the restoring force of the springs 600a, 600b apply, the two modules 300, 400 are attached to each other.

The first bearings 710a, 710b may be formed in the connecting part between the springs 600a, 600b and the modules 300, 400, and the second bearings 720a, 720b may be formed in the connecting part between the two modules 300, 400. The first and second bearings 710a, 710b, 720a, 720b may be employed for smoother actuating of the function module 300.

The number and shapes and locations of the magnets, bearings, springs, and the first and second bearings illustrated in FIGS. 10 and 11 may be modified appropriately according to the exemplary embodiments of the present invention.

The actuating device and the module displacement adjusting device according to the exemplary embodiments of the present invention compensate minute vibration such as hand tremor, and thus are applicable to a variety of electronic areas as an optical image stabilizer. In particular, the actuating device and the module displacement adjusting device maybe used effectively in miniaturized electronic devices such as mobile phones with camera function, or PDA.

According to the exemplary embodiments of the present invention, a miniaturized actuating device can be fabricated through simple processes, and such actuating device actuates a function module in an appropriate direction using deformable membrane and rods and thus minimizes impacts by hand tremor. Such actuating device particularly has minimized thickness, which can realize electronic devices in compliance with the current customers' demands for slimmer products. Furthermore, actuating in two-axis direction in a single plane is enabled, and size of the driving power and locations and shapes of rods are adjusted appropriately to control the speed of actuating with precision.

The foregoing embodiments and advantages are merely exemplary and are not to be construed as limiting the present invention. The present teaching can be readily applied to other types of apparatuses. The description of the exemplary embodiments of the present invention is intended to be illustrative, and not to limit the scope of the claims. Many alternatives, modifications, and variations will be apparent to those skilled in the art.

What is claimed is:

1. An actuating device, comprising:
   a deformable membrane;
   walls formed on the membrane to define cavities;
   rods formed within the cavities, and on the surface of the membrane on one side with reference to a cavity center, to move in association with the deformation of the membrane; and
   an actuating unit formed on a lower surface of the membrane to be piezoelectrically driven to deform the membrane.

2. The actuating device of claim 1, wherein the actuating unit comprises a first electrode, a piezoelectric layer and a second electrode stacked on the lower surface of the membrane in sequence.

3. The actuating device of claim 2, wherein the area of at least one of the first electrode, the piezoelectric layer and the second electrode is smaller than the area of the membrane where the cavities are formed.

4. The actuating device of claim 1, wherein the walls define a plurality of cavities on the membrane, and the rods are formed within the plurality of cavities respectively.

5. The actuating device of claim 4, wherein the plurality of cavities are defined by a plurality of blocks, and positions and shapes of the rods within the cavities are different from each other according to the corresponding blocks.

6. The actuating device of claim 1, wherein the height of the rods is greater than that of the walls.

7. The actuating device of claim 1, further comprising an insulating film provided between the rods and the membrane, and between the walls and the membrane.

8. A module displacement adjusting device, comprising:
   a function module; and
   an actuating module which adjusts the displacement of the function module by using rods which are placed within cavities formed on a deformable membrane, and on one side with reference to a cavity center, to move in association with the deformation of the membrane.

9. The module displacement adjusting device of claim 8, further comprising a first electrode, a piezoelectric layer, and a second electrode stacked on a lower side of the membrane in sequence.

10. The module displacement adjusting device of claim 9, further comprising a power supply unit to supply power for displacement adjustment of the function module to the first and second electrodes.

11. The module displacement adjusting device of claim 9, wherein the area of at least one of the first electrode, the piezoelectric layer and the second electrode is smaller than the area of the membrane where the cavities are formed.

12. The module displacement adjusting device of claim 8, wherein the actuating module further comprises walls which define a plurality of cavities on the membrane, and wherein the rods are formed within the plurality of cavities respectively.

13. The module displacement adjusting device of claim 12, wherein the plurality of cavities are defined by a plurality of blocks, and positions and shapes of the rods within the cavities are different from each other according to the corresponding blocks.

14. The module displacement adjusting device of claim 8, further comprising:
    a magnet unit which provides a magnetic attracting force between the function module and the actuating module to cause the function module and the actuating module to attach to each other; and
    a bearing unit arranged on an plane of attachment formed by the magnetic attracting force.

15. The module displacement adjusting device of claim 8, further comprising:
    a spring unit which provides a tension between the function module and the actuating module, and causes the function module and the actuating module to attach to each other;
    a first bearing unit arranged on connecting areas between the function module and the spring unit and between the actuating module and the spring unit; and
    a second bearing unit arranged on a plane of attachment formed by the tension.

16. The module displacement adjusting device of claim 8, wherein the height of the rods is greater than that of the walls.

* * * * *